United States Patent [19]

Heeren

[11] E Re. 29,234

[45] Reissued May 24, 1977

[54] FET LOGIC GATE CIRCUITS

[75] Inventor: Richard H. Heeren, Palatine, Ill.

[73] Assignee: Teletype Corporation, Skokie, Ill.

[22] Filed: July 5, 1973

[21] Appl. No.: 376,497

Related U.S. Patent Documents

Reissue of:

[64] Patent No.: 3,596,108
Issued: July 27, 1971
Appl. No.: 874,086
Filed: Oct. 27, 1969

[52] U.S. Cl. ..... 340/347 DD; 307/205; 307/251

[51] Int. Cl.[2] ..... H03K 13/24

[58] Field of Search ..... 340/347 DD; 307/205, 307/246, 251, 215, 218

[56] References Cited

UNITED STATES PATENTS

| | | | |
|---|---|---|---|
| 3,355,598 | 11/1967 | Tuska | 307/251 |
| 3,356,858 | 12/1967 | Wanlass | 307/205 |
| 3,500,062 | 3/1970 | Annis | 307/205 X |
| 3,502,908 | 3/1970 | Christensen | 307/246 |
| 3,502,909 | 3/1970 | Christensen et al. | 307/251 |
| 3,541,353 | 11/1970 | Seelbach et al. | 307/205 X |

*Primary Examiner*—Charles D. Miller
*Attorney, Agent, or Firm*—W. G. Dosse; M. Pfeffer

[57] ABSTRACT

A gate circuit includes field effect transistors interconnected to provide an output signal of a first type whenever all input signals are of predetermined types, and to provide an output of a second type whenever any input signal is other than one of the predetermined types, wherein the only current required by the circuit is that supplied by the output of the circuit to a load which is driven by the circuit. Preferably, the circuit includes a plurality of logic-steering field effect transistors connected with their controlled electrodes in series such that an input signal is connected to an output load device, such as a capacitor, only if all of the logic-steering transistors have been turned ON. A ground return transistor is provided for each logic-steering transistor and operates to provide a ground at the output of the logic-steering transistor if an improper input signal is received. Binary data signals, or inversions thereof, are connected to the gates of the transistors in desired patterns to operate the load device only on a proper combination of input signals.

18 Claims, 4 Drawing Figures

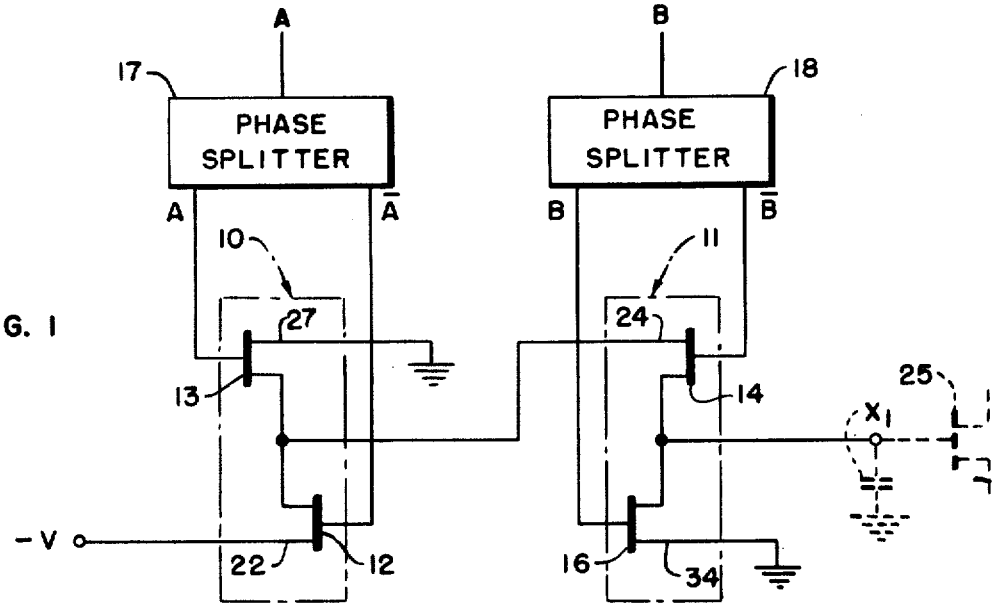
FIG. 1
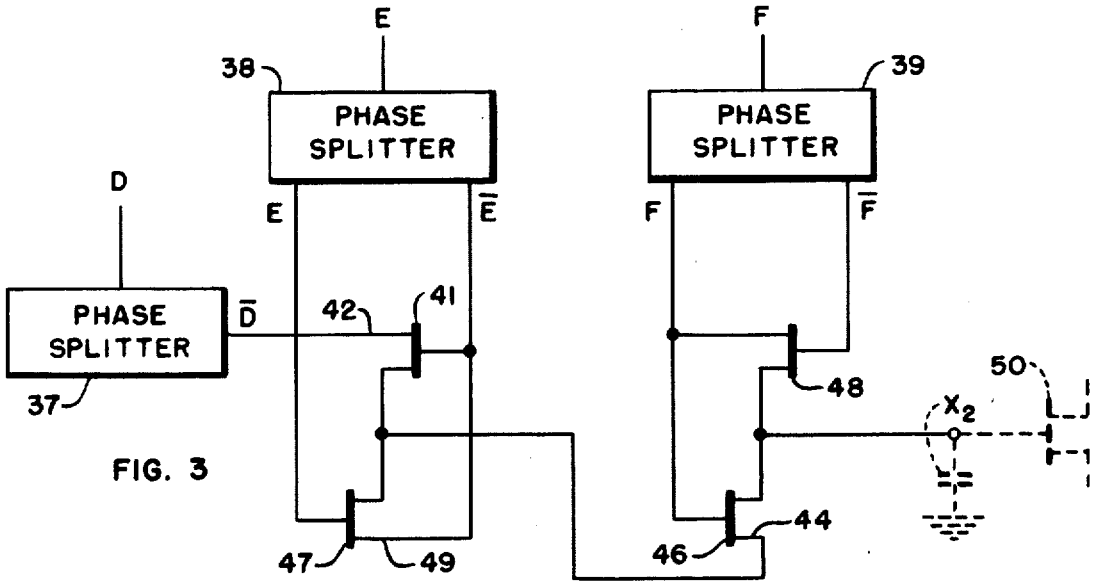
FIG. 3
FIG. 4
| D | E | F | $X_2$ |
|---|---|---|---|
| 0 | 0 | 0 | 0 |
| 1 | 0 | 0 | 0 |
| 0 | 1 | 0 | 0 |
| 1 | 1 | 0 | 0 |
| 0 | 0 | 1 | 1 |
| 1 | 0 | 1 | 0 |
| 0 | 1 | 1 | 0 |
| 1 | 1 | 1 | 0 |
FIG. 2
| A | B | $X_1$ |
|---|---|---|
| 1 | 1 | 0 |
| 1 | 0 | 0 |
| 0 | 1 | 0 |
| 0 | 0 | 1 |
INVENTOR
RICHARD H. HEEREN
BY J. L. Landis
ATTORNEY

FET LOGIC GATE CIRCUITS

Matter enclosed in heavy brackets [ ] appears in the original patent but forms no part of this reissue specification; matter printed in italics indicates the additions made by reissue.

BACKGROUND OF THE INVENTION

The present invention relates to gate circuits, and in particular to MOS gate circuits suitable for fabrication by integrated circuit techniques.

Existing integrated logic gates often employ field effect transistors as internal load drain devices, thereby requiring that a bias current from a power supply be supplied to the circuit logic. The energy supplied from the power supply is dissipated on the circuit chip, limiting the packing density obtainable. Also more than the minimum number of circuit devices are employed. A further disadvantage is that the necessary power supply leads increase circuit complexity.

A specific object of the invention is to provide a field effect transistor gate structure wherein the only current required by the circuit is that supplied to an output load device which is driven by the circuit.

A further object of the invention is to provide a field effect transistor gate structure wherein the only current required by the circuit is that supplied to an output load device which is driven by the circuit, and wherein said output load current is supplied by the inputs to the circuit.

SUMMARY OF THE INVENTION

The foregoing and other objects of the invention are accomplished by providing a first data signal on a first lead, a second data signal on a second lead and an inversion thereof on a third lead, and a third data signal on a fourth lead and an inversion thereof on a fifth lead. MOS devices are employed to transfer the signal on the first lead to a first output port in response to a second data signal of one type, and to transfer the signal on the third lead to the first output port in response to a second data signal of a second type. MOS devices are further employed to transfer the signal at the first output port to an output load impedance in response to a third data signal of one type, and to transfer the signal on the fourth lead to the output load impedance in response to a third data signal of a second type.

Preferably, MOS devices are arranged in a MOSFET coincidence gate circuit for producing an output signal to charge a capacitor only in response to one selected combination of a plurality of binary data signals, and for discharging the capacitor, if previously charged, for all other combinations of the data signals. Phase splitters provide two input signals for each binary data signal, one corresponding to the binary data signal and one to its complement. A plurality of logic-steering FETs ("LFs") are arranged in a sequence such that each has its gate connected to a first one of the input signals for an associated bit selected such that each LF becomes conductive only when the associated bit assumes the selected state. A capacitor-charging signal is supplied to a first controlled terminal of the first LF in the sequence, and each subsequent LF has its first controlled terminal connected in series with the second controlled terminal of the preceding LF. The output capacitor is connected to the second controlled terminal of the last LF in the sequence so that the capacitor is connected to the charging signal through all the LFs only whenever all of the LFs have been rendered conductive in response to the selected combination of the binary input signals. A plurality of ground-return FETs ("GFs") are arranged in a sequence corresponding to that of the LFs, each having its gate connected to the second input signal for an associated binary data signal such that each GF becomes conductive only when the associated binary data signal assumes the nonselected state. The last GF in the sequence has its controlled terminals connected in series between the output capacitor and a source of ground potential to provide a ground-discharge path for the capacitor whenever the last binary data signal assumes the nonselected state. Each preceding GF is connected in series between the first controlled terminal of the following LF and a source of ground potential to provide a ground-discharge path for the capacitor whenever the associated bit assumes the nonselected state and all following bits have assumed the selected state.

Other objects, advantages and features of the invention will be apparent from the following detailed description of specific embodiments thereof, when taken in conjunction with the appended drawings.

BRIEF DESCRIPTION OF THE DRAWINGS

FIG. 1 is a circuit diagram of a first embodiment of the invention.

FIG. 2 is a truth table describing the logic performed by the circuit of FIG. 1.

FIG. 3 is a circuit diagram of a second embodiment of the invention.

FIG. 4 is a truth table describing the logic performed by the circuit of FIG. 3.

DETAILED DESCRIPTION—FIRST EMBODIMENT

FIGS. 1 and 3 of the drawing show two embodiments of a gate circuit structure made in accordance with this invention, both of which embodiments are shown as applied to MOSFET (metal-oxide-silicon field-effect transistor) integrated circuits using P-channel enhancement-mode devices. Each field effect transistor employed herein is characterized in that a negative voltage applied to its gate will induce a low impedance between a pair of controlled terminals, while a ground potential applied to its gate will induce a high impedance between a pair of controlled terminals. Although the ensuing description concerns P-channel enhancement-mode devices, it should be understood that the principles of the invention apply equally well to circuits using different types of field-effect devices.

Referring to FIG. 1 there is shown a gate circuit structure using MOS field effect transistors as the primary elements of each stage of the circuit, the function of which circuit is defined by the truth table shown in FIG. 2. The circuit contains two identical circuits 10 and 11, each enclosed in dashed lines, which serve as basic building blocks for circuits built in accordance with this invention and which are disclosed in a related copending application of applicant, Ser. No. 822,533, filed May 7, 1969. Each identical circuit, such as circuit 10, includes two field effect transistors such as transistors 12 and 13. The transistor 12 serves as a logic steering device while the transistor 13 serves as a ground return device. The circuit 11 employs a logic steering transistor 14 and a ground return transistor 16.

In operation two separate binary data signals, in which a "1" is represented by a −V. potential and "0" is represented by ground potential, are applied to input terminals A and B. The input terminals A and B are connected to the circuits 10 and 11 by two phase splitters 17 and 18. Each phase splitter has a signal input terminal A and B, respectively, and two output terminals A and $\bar{A}$, and B and $\bar{B}$, respectively. A signal will appear on output terminal A which is identical to the signal applied to the input terminal A while the complement thereof will appear on output terminal $\bar{A}$. In a like manner the signal applied to the input terminal B will appear on the output terminal B while the complement thereof will appear on output terminal $\bar{B}$. One compatible form of phase splitter, using MOS integrated circuits, is disclosed in another copending application of applicant, Ser. No. 822,520, filed May 7, 1969. It should also be apparent that a simple inverter circuit would serve the same function as the phase splitters 17 or 18. When an inverter is employed, the input terminals A and B would also serve as output terminals A and B, respectively.

In the specific example of FIG. 1, the circuit is connected as a two-input AND-gate, which is designed to provide an output only when the inputs A and B are both "0." When this preset combination is applied, the two outputs, A and $\bar{A}$, of the phase splitter 17 will provide a "0" and "1" respectively. The "1" provided at the output $\bar{A}$ is applied to the gate of the transistor 12, thereby rendering the transistor 12 conductive and allowing it to pass a −V. potential applied to a terminal 22 to a terminal 24 of the transistor 14. The "0" obtained from the output A of the phase splitter 17 is applied to the gate of the transistor 13. However, the characteristic of the transistor 13 is such that a "0" applied to its gate will not render it conductive; therefore the transistor 13 is unable to pass a ground potential applied to a terminal 27 to the terminal 24 of the transistor 14.

The "0" at the input B of the phase splitter 18 provides a "0" and "1" at the two outputs, B and $\bar{B}$, respectively. The "1" appearing at the output $\bar{B}$ of the phase splitter 18 is applied to the gate of the transistor 14, rendering the transistor 14 conductive and allowing it to pass the −V. potential appearing at the terminal 24 to a load device, such as an output character $X_1$. This capacitor $X_1$ preferably consists of the distributed capacitance between the transistors 14 and 16 and a transistor 25 of a succeeding circuit (shown in dashed lines) plus the insulated gate capacitance of the transistor 25. The "0" appearing at the output B of the phase splitter 18 and applied to the gate of the transistor 16 will not render the transistor 16 conductive; therefore the transistor 16 is unable to pass a ground potential applied to a terminal 34 to the output capacitor $X_1$.

It is seen that by the proper coincidence of inputs the transistors 12 and 14 have been enabled to steer the −V potential appearing at the terminal 22 of the transistor 12 through the transistors 12 and 14 to the output capacitor $X_1$; and the transistors 13 and 16 have been prevented from coupling the ground potential appearing at the terminals 27 and 34, respectively, to the output capacitor $X_1$. This condition is indicated in the last line of FIG. 2.

Assume that an input wherein A is "1" and B is "0" is applied to the gate circuit, so that the condition for obtaining a "1" output from the circuit, as shown by the truth table of FIG. 2, is not met. The outputs obtained at A and $\bar{A}$, of the phase splitter 17 will be "1" and "0" respectively. The "0" obtained from the output $\bar{A}$ is applied to the gate of the transistor 12, thereby preventing the −V. potential on the terminal 22 of the transistor 12 from being passed through the transistor 12 to the terminal 24 of the transistor 14. The "1" obtained from the output A of the phase splitter 17 and applied to the gate of the transistor 13, however, will enable the transistor 13 to conduct and pass the ground potential applied to the terminal 27 through the transistor 13 to the terminal 24 of the transistor 14.

The "1" obtained from the output $\bar{B}$ of the phase splitter 18 and applied to the gate of the transistor 14 will render the transistor 14 conductive and enable it to pass the ground potential at the terminal 24 to the output capacitor $X_1$. The "0" obtained from the output B of the phase splitter 18 and applied to the gate of the transistor 16 fails to render the transistor 16 conductive. If a "1" were initially stored on the output capacitor $X_1$, it will be discharged to ground through the transistors 14 and 13 which have been rendered conductive by the signals "1" and "0" appearing on the inputs A and B, respectively. Similarly, all signals applied to the inputs A and B other than "0" and "0," respectively, will fail to provide a "1" at the output capacitor $X_1$, since the −V. potential will be blocked by one or both steering transistors 12 and 14 and the capacitor $X_1$, if charged, will discharge to ground through the transistor 16 or 13.

It is to be noted that, in the circuit of FIG. 1, no current flows except that which is necessary to charge or to discharge the output capacitor $X_1$. If the circuit has just received a proper input and the capacitor has been charged to the "1" state, it will either remain charged, if the next input is also proper, or it will be discharged through a transistor to ground if the next input is improper. The gate circuit may be programmed to provide a "1" output for any particular applied to the input terminals A and B by connecting whichever output of the phase splitter is to be a "1," for the particular input to the phase splitter, to the gate of the steering transistor associated with that particular phase splitter; and by connecting the other output of the phase splitter, which is to be a "0" for the particular input to the phase splitter, to the gate of the ground return transistor associated with that particular phase splitter.

SECOND EMBODIMENT

FIG. 3 illustrates a preferred, simplified embodiment of the gate circuit of this invention, having three inputs D, E and F, for achieving the same type of gate function as the circuit of FIG. 1. The ground and the −V potential reference leads to the gate structure have been eliminated by connecting the ground return transistor terminal, which would otherwise be connected to the ground lead as shown in FIG. 1, to the normal or complementary output lead of the associated phase splitter, whichever is to be at "1" when a proper input is received which will enable a "1" to be obtained at the output of the circuit. The output voltages from the phase splitters then substitute for the ground and the −V potentials which were otherwise provided to the circuit of FIG. 1 through separate power supply leads. The input to the first stage of the gate circuit is provided by an output D of a phase splitter 37, which output is to be a "1" when the predetermined inputs are supplied to the circuit to provide a "1" at an output capacitor $X_2$. (No separate output D is utilized in this particular example). By analogy to the operation of the circuit of FIG. 1 as described above, only if the input D is "0," the input E is "0," and the input F is "1" will the input requirements be satisfied to provide a "1" at the output capacitor $X_2$ as shown in the truth table of FIG. 4. For any other combination of inputs a "0" will be obtained at the output capacitor.

For example, assume that the desired input signal wherein D is "0," E is "0," and F is "1" is applied to the circuit. The output $\overline{D}$ obtained from the phase splitter 37 will be a "1," the outputs E and E obtained from a phase splitter 38 will be "0" and "1" respectively, and the outputs F and $\overline{F}$ obtained from a phase splitter 39 will be "1" and "0" respectively. The "1" obtained at the output $\overline{E}$ of the phase splitter 38 is applied to the gate of a steering transistor 41, rendering the transistor 41 conductive and allowing it to pass the "1" signal, being applied to a terminal 42 by the output $\overline{D}$ of the phase splitter 37, to a terminal 44 of a second steering transistor 46. The "0" obtained from the output E of the phase splitter 38 and applied to the gate of a first ground return transistor 47 will not render the transistor 47 conductive.

The "1" obtained from the output F of the phase splitter 39 and applied to the gate of the transistor 46 will render the transistor 46 conductive and allow it to pass the "1" signal being applied to the terminal 44 to the output capacitor $X_2$. This capacitor $X_2$ consists of the distributed capacitance between the transistors 46 and 48 and a transistor 50 of a succeeding circuit (shown in dashed lines) plus the insulated gate capacitance of the transistor 50. The "0" obtained from the output $\overline{F}$ of the phase splitter 39 and applied to the gate of a second ground return transistor 48 will not render the transistor 48 conductive. It is seen that, by the predetermined coincidence of inputs, the transistors 41 and 46 have been enabled to steer the "1" signal provided from the output D of the phase splitter 37 to the output capacitor $X_2$.

To illustrate the manner in which the circuit of FIG. 3 provides a "0" at the output capacitor $X_2$ when an input other than "0," "0" and "1" is applied to the inputs D, E and F, respectively, assume that the input signal applied is "0," "1" and "1." Since the input D is "0," a "1" is obtained from the output $\overline{D}$ of the phase splitter 37 and applied to the terminal 42 of the transistor 41. With a "1" at the input E, a "0" is obtained at the output $\overline{E}$ of the phase splitter 38 and applied to the gate of the transistor 41 and to a terminal 49 of the transistor 47. The transistor 41 is not rendered conductive, however, since its characteristics are such that a "0" applied to its gate will fail to render it conductive. Thus, the "1" signal from the output $\overline{D}$ cannot be passed by the steering transistor 41 to the capacitor $X_2$. The "1" obtained from the output E of the phase splitter 38 is applied to the gate of the transistor 47, thereby rendering it conductive and allowing it to pass the "0" ($\overline{E}$) being presented to the terminal 49 to the terminal 44 of the steering transistor 46. It is to be noted that the "0" which is being applied to the terminal 44 of the transistor 46 has been obtained from the output $\overline{E}$ of the phase splitter 38 and has been passed through the transistor 47 which was rendered conductive as a result of an improper input to the phase splitter 38. The "1" obtained from the output F of the phase splitter 39 is applied to the gate of the transistor 46, rendering the transistor 46 conductive and allowing it to pass the "0" being applied to the terminal 44 to the output capacitor $X_2$. If the output capacitor $X_2$ was previously charged to the "1" state as a result of the proper coincidence of inputs to the circuit, it will now be discharged through transistors 46 and 47 to the "0" output $\overline{E}$ of the phase splitter 38, if, however, the capacitor $X_2$ was previously charged to the "0" state it will remain in the "0" state and no current will flow when the transistors 46 and 47 are rendered conductive.

Similarly, it should be obvious that all other nonprogrammed combinations of inputs D, E, F will not charge the capacitor $X_2$ to a "1" state and will discharge that capacitor, if charged, to a "0" input (F, $\overline{E}$ or $\overline{D}$). For example, if the input F is "0" instead of "1" the second steering transistor 46 will not turn ON to pass a "1" signal, if present on the lead 44, to the capacitor $X_2$, and the capacitor if charged will be discharged through the transistor 48 to the output F, which is "0" in this case. If the input D is "1," and therefore the output $\overline{D}$ is "0," then only a "0" can be applied to the capacitor $X_2$ through the steering transistors 41 and 46, if both are ON (corresponding to an input signal "1," "0" and "1").

It is to be noted that, in the circuit of FIG. 3, no current flows except that which is necessary to charge and to discharge the output capacitor $X_2$, thereby minimizing the power dissipated on the silicon chip containing the circuit. A further point to be noted is that the output load device, which was described as a capacitor for the two particular embodiments of the invention disclosed, need not be a capacitor, but may be any impedance which is to be driven by the gate structure.

Although two particular embodiments of the invention have been described in detail, it is to be understood that various modifications varied to fit particular conditions will be apparent to those skilled in the art. For example, although this circuit has been described through the use of two common building blocks such as circuits 10 and 11 of FIG. 1, thereby providing for two possible inputs to that circuit, and for three possible inputs to the circuit of FIG. 3, as many building blocks may be connected in series as are necessary to provide any desired number of inputs. The building blocks may be serially connected by merely connecting the output controlled terminal of the steering transistor of the preceding building block to the input controlled terminal of the steering transistor of the succeeding building block. Also, although this invention has been described in conjunction with MOS integrated transistor circuitry, it should be understood that the principles of the invention could also be applied to circuits using discrete conventional components.

What I claim is:

1. A gate circuit, which comprises:

means for providing a signal on a first lead;

means responsive to a second data signal for providing the second data signal on a second lead and an inversion thereof on a third lead;

means for transferring the signal on the first lead to a first output port in response to a second data signal of one type, and for transferring the signal on the third lead to the first output port in response to a second data signal of a second type;

means responsive to a third data signal for providing the third data signal on a fourth lead and an inversion thereof on a fifth lead;

an output load impedance; and means for transferring the signal at the first output port to the output load impedance in response to a third data signal of one type, and for transferring the signal on the fourth lead to the output load impedance in response to a third data signal of a second-type.

2. A gate circuit, as recited in claim 1, where the output load impedance is a capacitor.

3. A gate circuit, comprising:

means for providing a first data signal on a first lead and an inversion thereof on a second lead;

means for providing a first constant voltage on a third lead and a second and different constant voltage on a fourth lead;

first and second field effect transistors each having a gate and a first and second controlled terminals;

means for connecting the first field effect transistor to the first and third leads, the first controlled terminal being connected to the third lead and the gate being connected to the first lead, the second controlled terminal serving as a first output port;

means for connecting the second field effect transistor to the second and fourth leads, the first controlled terminal being connected to the fourth lead and the gate being connected to the second lead; and means for connecting the second controlled terminal of the first field effect transistor to the second controlled terminal of the second field effect transistor.

4. A gate as recited in claim 3, further comprising:

means for providing a second data signal on a fifth lead and an inversion thereof on a sixth lead;

third and fourth field effect transistors each having a gate and first and second controlled terminals;

means for connecting the third field effect transistor to the first output port and to the sixth lead, the first controlled terminal being connecting to the first output port and the gate being connected to the sixth lead, the second controlled terminal serving as a second output port;

means for connecting the fourth field effect transistor to the third and fifth leads, the first controlled terminal being connected to the fourth lead and the gate being connected to the fifth lead; and means for connecting the second controlled terminal of the third field effect transistor to the second controlled terminal of the fourth field effect transistor.

5. A circuit as recited in claim 4, wherein the means for providing a first data signal on a first lead and an inversion of said first data signal on a second lead comprises a first phase splitting circuit, and wherein the means for providing a second data signal on a fifth lead and an inversion of the second data signal on a sixth lead comprises a second phase splitting circuit.

6. A gate circuit, comprising:

means for providing a first data signal on a first lead;

means responsive to a second data signal for providing the second data signal on a second lead and an inversion thereof on a third lead;

means responsive to a third data signal for providing the third data signal on a fourth lead and an inversion thereof on a fifth lead;

first, second, third and fourth field effect transistors each having a gate and first and second controlled terminals;

means for connecting the first field effect transistor to the first and third leads, the first controlled terminal being connected to the first lead and the gate being connected to the third lead, the second controlled terminal forming a first output port;

means for connecting the second field effect transistor to the second and third leads, the first controlled terminal being connected to the third lead and the gate being connected to the second lead;

means for connecting the third field effect transistor to the fourth and fifth leads, the first controlled terminal being connected to the fourth lead and the gate being connected to the fifth lead, the second controlled terminal providing a second output port;

means for connecting the gate of the fourth field effect transistor to the fourth lead;

means for interconnecting the second controlled terminals of the first, second and fourth field effect transistors; and means for connecting the first controlled terminal of the fourth field effect transistor to the second controlled terminal of the third field effect transistor.

7. A gate circuit as recited in claim 6 wherein the means responsive to a second data signal for providing the second data signal on a second lead and an inversion thereof on a third lead comprises a first phase splitting circuit and wherein the means responsive to a third data signal for providing the third data signal on a fourth lead and an inversion thereof on a fifth lead comprises a second phase splitting circuit.

8. A MOSFET coincidence gate circuit for producing an output signal to charge a capacitor only in response to one selected combination of a plurality of binary data signals, and for discharging the capacitor, if previously charged, for all other combinations of the data signals, which comprises:

means for providing two input signals for each bit, one corresponding to the bit and one to its complement;

a plurality of logic-steering FETs ("LFs") arranged in a sequence, each of which has its gate connected to a first one of the input signals for an associated bit selected such that each LF becomes conductive only when the associated bit assumes the selected state;

means for supplying a capacitor-charging signal to a first controlled terminal of a first LF in the sequence, each subsequent LF having its first controlled terminal connected in series with the second controlled terminal of preceding LF, the output capacitor being connected to the second controlled terminal of the last LF in the sequence so that the capacitor is connected to the charging signal only whenever all of the LFs have been rendered conductive in response to the selected combination of the input signals; and a plurality of ground-return FETs ("GFs") arranged in a sequence corresponding to that of the LFs, each of which has its gate connected to the second input signal for an associated bit such that each GF becomes conductive only when the associated bit assumes the nonselected state, the last GF in the sequence having its controlled terminals connected in series between the capacitor and a source of ground potential to provide a ground-discharge path for the capacitor whenever the last bit assumes the nonselected state, each preceding GF being connected in series between the first controlled terminal of the following LF and a source of ground potential to provide a ground-discharge path for the capacitor whenever the associated bit assumes the nonselected state and all following bits have assumed the selected state.

9. A gate circuit as recited in claim 8, wherein:

an additional binary data signal is provided, the state of which is to be detected in combination with the two others, the two possible states of the additional data signal being capable of (1) charging and (2) discharging the capacitor as recited in claim 8, the reverse being true of the complement of the additional data signal; and the means for supplying the capacitor-charging signal comprises means for connecting a selected one of the additional data signal and its complement to the first controlled terminal of the first LF, the one being selected to charge the capacitor when the additional data signal assumes the selected state, and to provide a ground-discharge path for the capacitor whenever the additional bit assumes the nonselected state and all bits recited in claim 8 have assumed the selected state.

10. A gate circuit as recited in claim 8, wherein:

the states of the binary data signals are (1) a discrete potential capable of rendering the FETs conductive and (2) a ground potential not so capable;

the second data input signal in each case comprises the discrete potential when the associated bit assumes the non-selected state to render each GF conductive in that case; and the souce of ground potential to which a controlled terminal of each GF is connected comprises the first data input signal associated with that GF, which is a ground potential whenever that GF is conductive.

*11. A digital decoding system for selectively decoding a multi-bit digital input signal, said system including first and second reference signal input means and at least one system output means, comprising in combination:*

*a. a first plurality of solid state switching circuits, each having at least one insulated gate transistor of a first channel type;*

*b. a second plurality of solid state switching circuits, each having at least one insulated gate transistor of said first channel type; wherein*

*c. Each of said first and second switching circuits have at least one signal input terminal and first and second switch terminals, and wherein*

*d. said first switching circuits are cascade coupled between said first reference signal means and said system output means such that at least one of said first switch terminals is coupled to said first reference signal, at least one of said second switch terminals is coupled to said system output means, and the remaining of said second switch terminals are connected to at least one of said first switch terminals; and wherein*

*e. said second plurality of switching circuits are connected such that at least one of said second switch terminals is connected to said second reference signal input means and in common with the remaining of said second switch terminals, and at least one of said first switch terminals is connected to said system output means with others of said first switch terminals being connected to at least one of said first switch terminals of said first switching circuit by means other than one of said first insulated gate transistors; and wherein*

*f. when a preselected value of said input signal is coupled to said system, said first switching circuits are OPEN and said second switching circuits are CLOSED, thereby coupling said first reference signal to said system output means; and wherein*

*g. for substantially all other values of said input signal coupled to said system, at least one of said first switching circuits is CLOSED and at least one of said second switching circuits is OPEN, thereby coupling said second reference signal to said system's output means.*

*12. A digital decoding system in accordance with claim 11 wherein said first channel type is P-channel.*

*13. A digital decoding system in accordance with claim 11 wherein said first channel type is N-channel.*

*14. A digital decoding system in accordance with claim 11 wherein said first and second switching circuits are formed within a common semiconductor substrate, and selectively interconnected by selectively doped regions within said common semiconductor substrate.*

*15. A digital decoding system for selectively decoding a multi-bit digital input signal, said system including first and second reference signal input means and at least one system output means, comprising in combination:*

*a. a first plurality of insulated gate field-effect transistors of a first channel type, each having source, drain and gate terminals; and*

*b. a second plurality of insulated gate field-effect transistors of said first channel type, each having source, drain and gate terminals; wherein*

*c. said first plurality of insulated gate field-effect transistors are source-to-drain cascade connected with the drain terminal of the first insulated gate field-effect transistor in the cascade being connected to said first reference signal means and the source terminal of the last insulated gate field-effect transistor in the cascade being connected to said system output means; and wherein*

*d. said second plurality of insulated gate field-effect transistors are connected such that the source terminal of each of said second plurality of transistors is connected in common to said second reference signal means with at least one of the drain terminals of said second plurality of transistors being connected to said systems output means with other drain terminals connected by means other than one of said first insulated gate field-effect transistors to a respective source terminal of a transistor of said first plurality of transistors; and wherein*

*e. when a predetermined value of said digital input signal is coupled to the gate of said first and second pluralities of transistors, said reference signal is coupled to said system output means; responsive to a second predetermined value of said input signal said second reference signal is coupled to said output means through one of said second plurality of transistors and the source-drain path of at least one of said first plurality of transistors, and responsive to a third predetermined value of said input said second reference signal is coupled to said output means only through one of said second plurality of transistors.*

*16. A digital decoding system in accordance with claim 15 wherein said first channel type is P-channel.*

*17. A digital decoding system in accordance with claim 15 wherein said first channel type is N-channel.*

*18. A digital decoding system in accordance with claim 15 wherein said first and second switching circuits are formed within a common semiconductor substrate, and selectively interconnected by selectively doped regions within said common semiconductor substrate.*

* * * * *

Disclaimer

Reissue No. 29,234.—*Richard H. Heeren*, Palatine, Ill. FET LOGIC GATE CIRCUITS. Patent dated May 24, 1977. Disclaimer filed July 7, 1977, by the assignee, *Teletype Corporation*.

Hereby enters this disclaimer to claim 3 of said patent.

[*Official Gazette August 23, 1977.*]